United States Patent [19]
Sun

[11] Patent Number: 6,153,459
[45] Date of Patent: Nov. 28, 2000

[54] METHOD OF FABRICATING DUAL GATE STRUCTURE OF EMBEDDED DRAM

[75] Inventor: Shih-Wei Sun, Taipei, Taiwan

[73] Assignee: United Microelectronics Corp., Hsinchu, Taiwan

[21] Appl. No.: 09/192,643

[22] Filed: Nov. 16, 1998

[51] Int. Cl.[7] .............................................. H01L 21/8244
[52] U.S. Cl. ...................... 438/238; 438/238; 438/239; 438/241; 438/253; 438/396; 437/60; 437/193; 437/200; 437/919
[58] Field of Search ...................................... 438/253, 396, 438/238, 239, 241, 287; 437/60, 193, 200, 919

[56] References Cited

U.S. PATENT DOCUMENTS

| | | | |
|---|---|---|---|
| 5,668,035 | 9/1997 | Fang et al. | 438/239 |
| 5,677,227 | 10/1997 | Yang et al. | 437/60 |
| 6,015,732 | 1/2000 | Williamson et al. | 438/253 |
| 6,037,222 | 3/2000 | Huang et al. | 438/257 |

*Primary Examiner*—David Nelms
*Assistant Examiner*—Phuc Dang
*Attorney, Agent, or Firm*—Hickman Coleman & Hughes, LLP

[57] ABSTRACT

A method of fabricating a dual gate of embedded DRAM forms a conductive layer on a substrate having a memory cell region and a logic circuitry. A gate structure is then formed on the substrate of the memory cell region and the conductive layer of the logic circuitry is removed by patterning the conductive layer. A polysilicon layer is then deposited and a dual gate structure is formed by patterning the polysilicon layer, and simultaneously, a polysilicon spacer is formed on the sidewall of the gate structure in the logic circuitry. The polysilicon spacer is then removed. An insulated spacer is formed on the sidewall of the gate structure and the dual gate structure, and a silicide layer is formed on the dual gate structure and the exposed substrate of the logic circuitry.

16 Claims, 5 Drawing Sheets

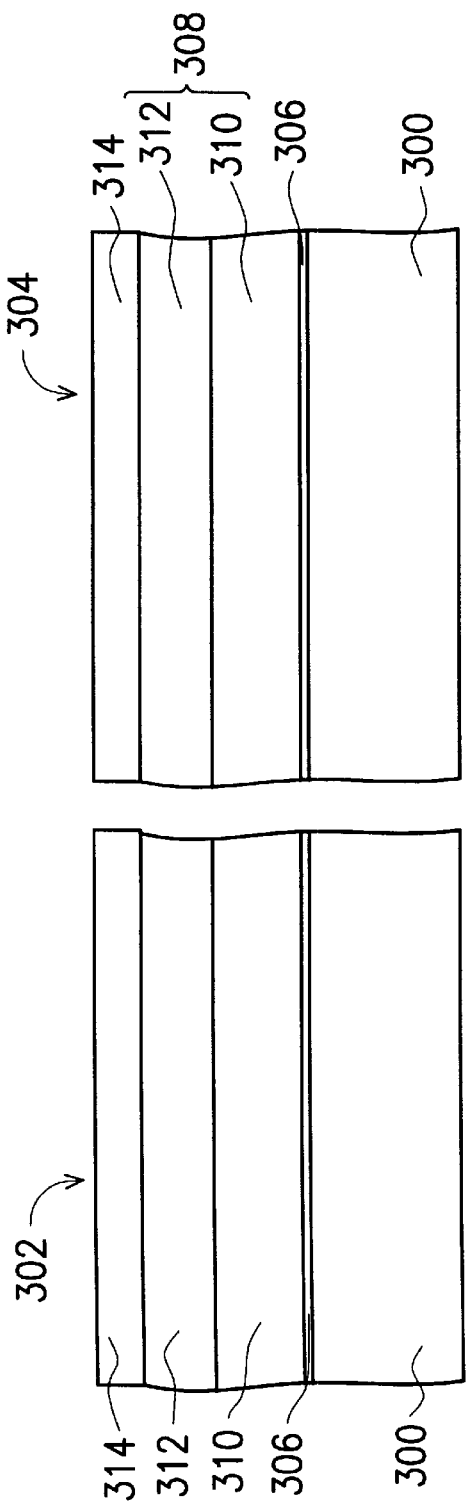
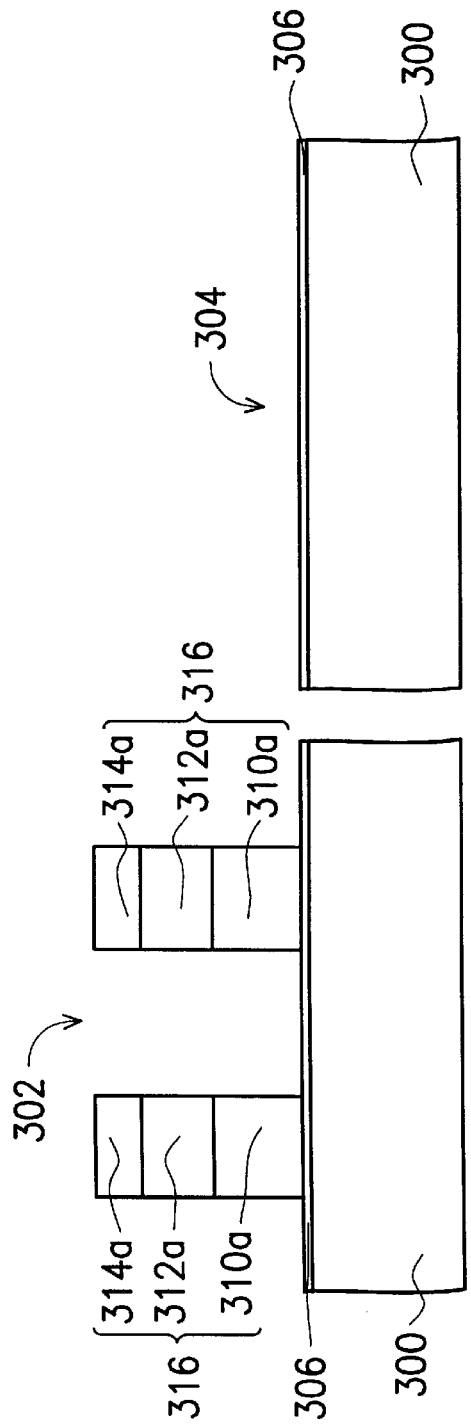
FIG. 3A
FIG. 3B

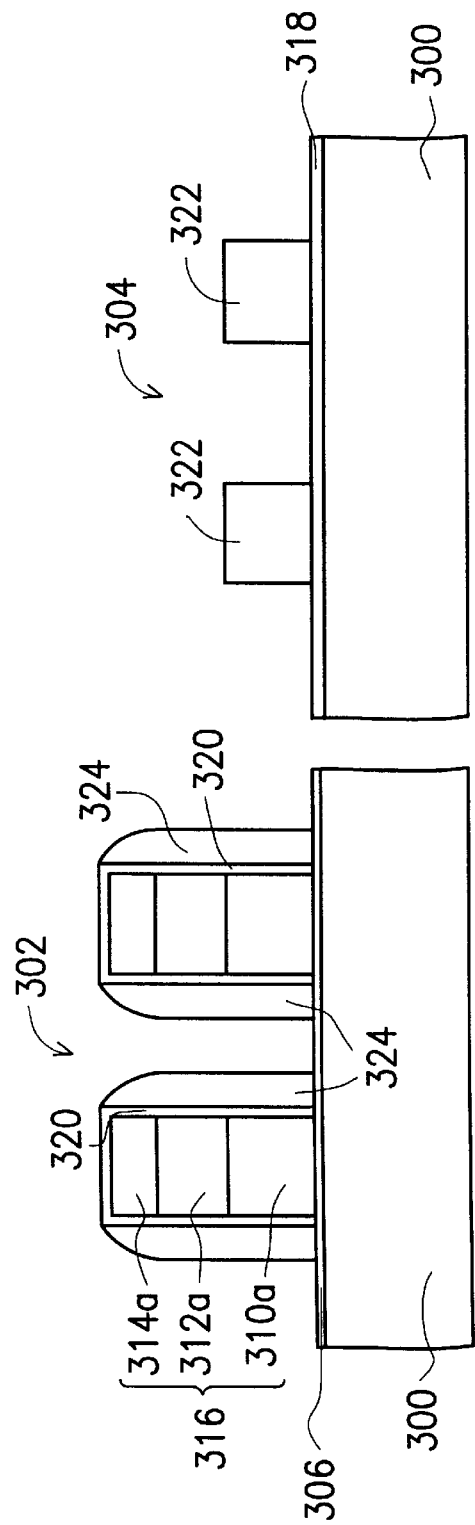
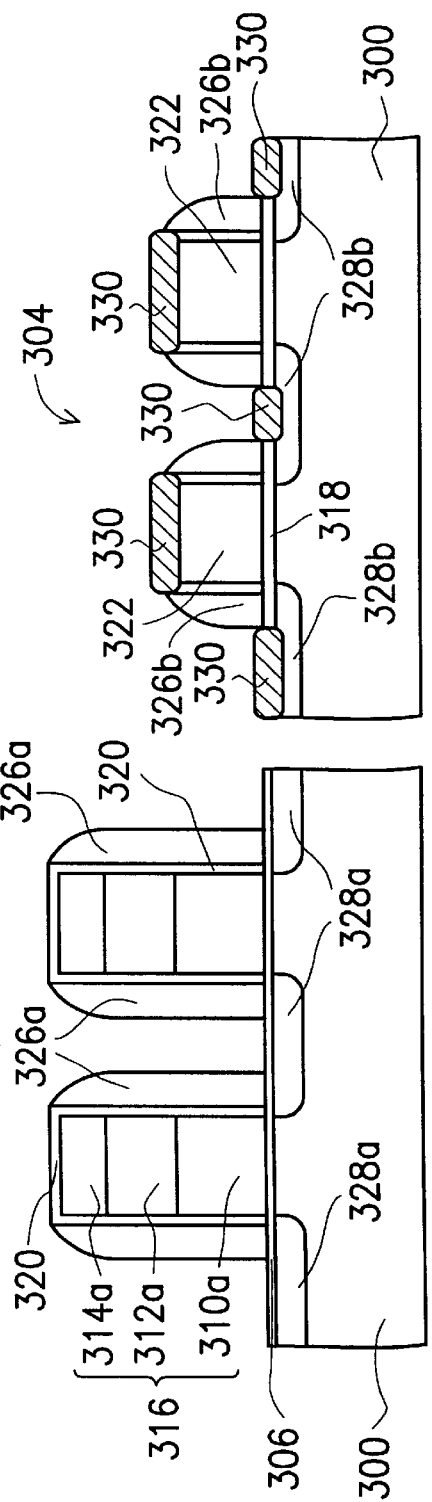
FIG. 3C
FIG. 3D

METHOD OF FABRICATING DUAL GATE STRUCTURE OF EMBEDDED DRAM

BACKGROUND OF THE INVENTION

1. Field of the Invention

The invention relates to a method of fabricating a dual gate structure of embedded dynamic random access memory (embedded DRAM), and more particularly to a method of fabricating a dual gate structure in a logical circuitry of embedded DRAM to prevent interdiffusion from occurring in the dual gate.

2. Description of the Related Art

A logic circuitry and a DRAM cell region (memory cell region hereinafter) formed on the same semiconductor substrate define an embedded DRAM. N-type nMOSFET and pMOSFET poly gate structure usually form a CMOS structure in conventional logic circuitry. Punch through is easily induced in PMOS with an N-type poly gate, which also has lower threshold voltage and poor turnoff characteristics. NMOS and PMOS are therefore composed of N-type and P-type poly gates, respectively, to form a dual gate structure as applied in the logic circuitry to overcome the problem as described above.

In order to prevent minute current leakage and refresh sensitivity from occurring in the source/drain region of embedded DRAM, salicide can not be formed on the source/drain region of the memory cell region. On the other hand, the resistance of the poly gate has to be reduced, therefore a tungsten silicide must be formed on the poly gate to improve the conductivity of the gate. For the dual gate structure of the embedded DRAM, the resistance of the poly gate is reduced by the formation of tungsten silicide thereon; however, the tungsten silicide induces some problems that need to be overcome.

FIGS. 1A–1D are schematic, cross-sectional views illustrating fabrication of the dual gate of an embedded DRAM wherein the embedded DRAM has a logic circuitry 118a and a memory cell region 118b. Referring to FIG. 1A, a substrate 100 is provided, and a gate oxide layer 102 and a polysilicon layer 104 are respectively formed on the substrate 100. P-type and N-type ions are respectively implanted into the polysilicon layer 104 by using implanting mask to cover the polysilicon layer 104. A tungsten silicide layer 106 is formed on the polysilicon layer 104 to improve the conductivity of the gate formed in subsequent processes. The tungsten silicide layer 106, polysilicon layer 104 and gate oxide layer 102 are patterned to form a dual gate structure 108a and gate structure 108b, as shown in FIG. 1B. FIG. 2 is a perspective view of the dual gate structure 108a and gate structure 108b of FIG. 1B. The dual gate structure 108a has N-type 104a' and P-type 104b" polysilicon layer and the gate structure 108b has N-type polysilicon layer 104b. Spacers 112 are formed on the sidewalls of the dual gate structure 108a and the gate structure 108b. The substrate 100 beside the dual gate structure 108a and gate structure 108b has source/drain regions 110, 114 formed therein. The source/drain regions 110, 114 are formed by implanting ions into the substrate 100. Ions in the source/drain regions 110, 114 need to be activated thermally or by rapid thermal process (RTP).

Referring to FIG. 1C, an oxide layer is formed over the substrate 100 and the oxide layer is then defined by photolithography. The oxide layer on the logical circuitry 118a is removed to expose the dual gate structure 108a and the source/drain region 114. A titanium layer is formed on the substrate 100 and the titanium layer is then reacted with the exposed substrate 100 to form salicide 120 on the source/drain region 114 by RTP, as shown in FIG. 1D.

The formation of the tungsten silicide 106 is for increasing conductivity of the polysilicon layer 104. However, due to the high backend thermal budget and because the diffusion coefficient of impurities in the tungsten silicide layer 106 is much larger than that in the polysilicon layer 104a, 104b, N-type ions in the polysilicon layer 104a' of the dual gate 108a diffuse into the P-type polysilicon layer 104a" and P-type ions in the polysilicon layer 104a" of the dual gate 108a diffuse into the N-type polysilicon layer 104a'. Therefore, interdiffusion 122 as seen in FIG. 2 is caused between the polysilicon layer 104a', 104a" of the dual gate 108a.

SUMMARY OF THE INVENTION

It is therefore an object of the invention to provide a method of fabricating a dual gate structure to prevent interdiffusion from occurring therein and improve device reliability.

To achieve these objects and advantages, and in accordance with the purpose of the invention, as embodied and broadly described herein, the invention is directed towards method of fabricating a dual gate of embedded DRAM. A conductive layer is formed on a substrate having a memory cell region and a logic circuitry. A gate structure is then formed on the substrate of the memory cell region and the conductive layer of the logic circuitry is removed by patterning the conductive layer. A polysilicon layer is then deposited and a dual gate structure is formed by patterning the polysilicon layer, and simultaneously, a polysilicon spacer on the sidewall of the gate structure is formed in the logic circuitry. The polysilicon spacer is then removed. An insulated spacer is formed on the sidewall of the embedded DRAM gate structure and the logic dual gate structure, and a silicide layer is formed subsequently on the logic dual gate structure and the exposed substrate of the logic circuitry.

It is to be understood that both the foregoing general description and the following detailed description are exemplary and explanatory only and are not restrictive of the invention, as claimed.

BRIEF DESCRIPTION OF THE DRAWINGS

FIGS. 3A–3D are schematic, cross-sectional views illustrating fabrication of embedded DRAM in a preferred embodiment according to the invention.

DESCRIPTION OF THE PREFERRED EMBODIMENTS

Figure 1A:
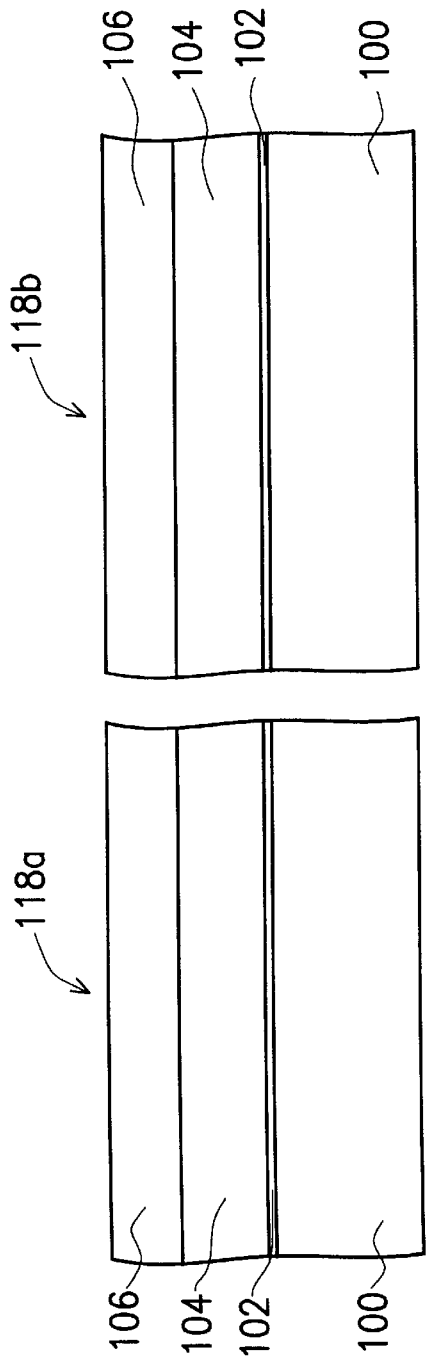
FIGS. 1A–1D are schematic, cross-sectional view illustrating fabrication of embedded DRAM as known in prior art.
Figure 1B:
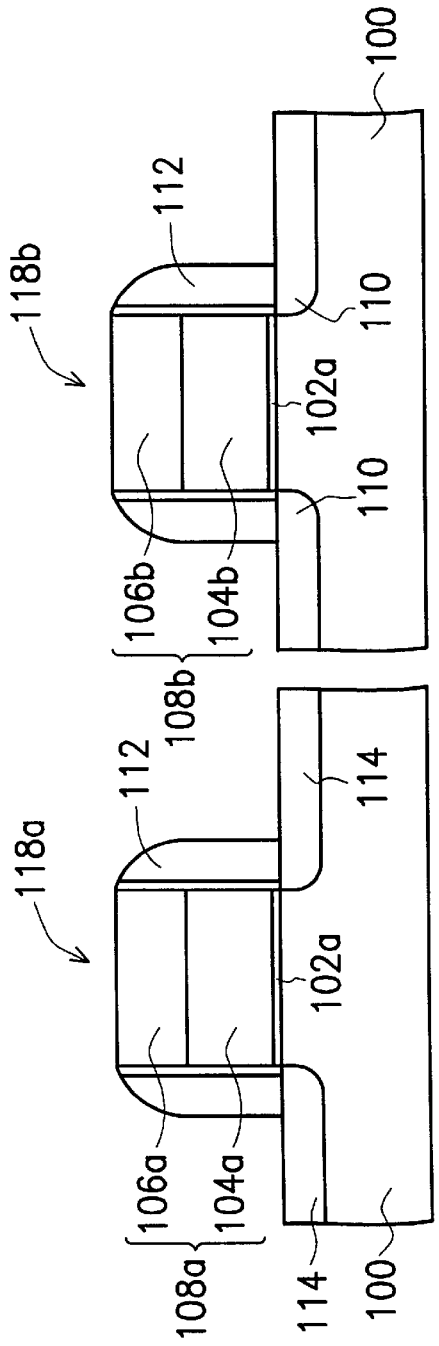
Figure 1C:
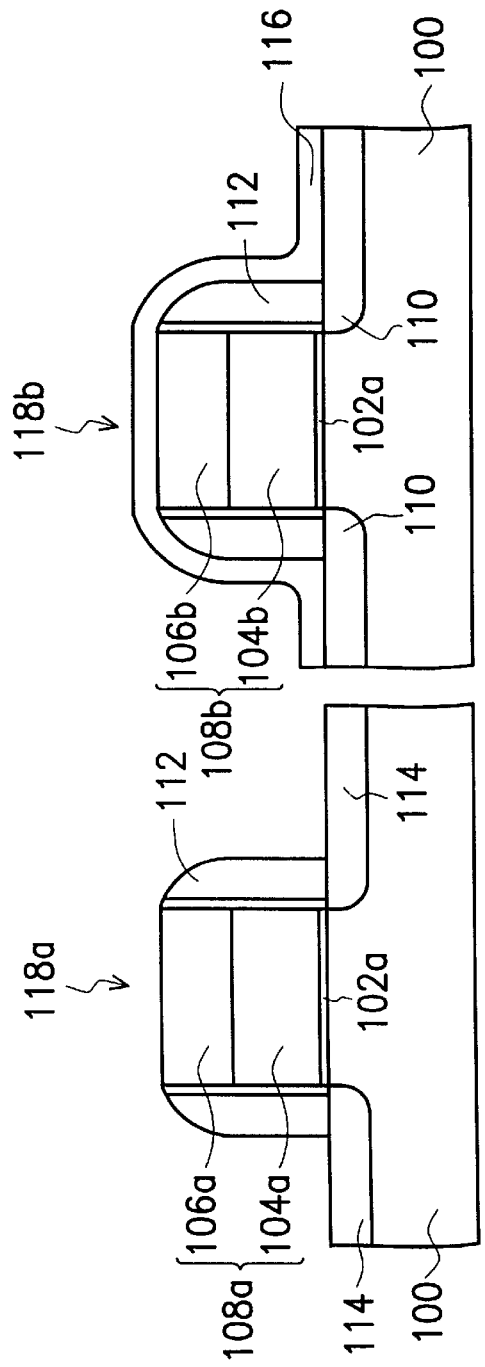
Figure 1D:
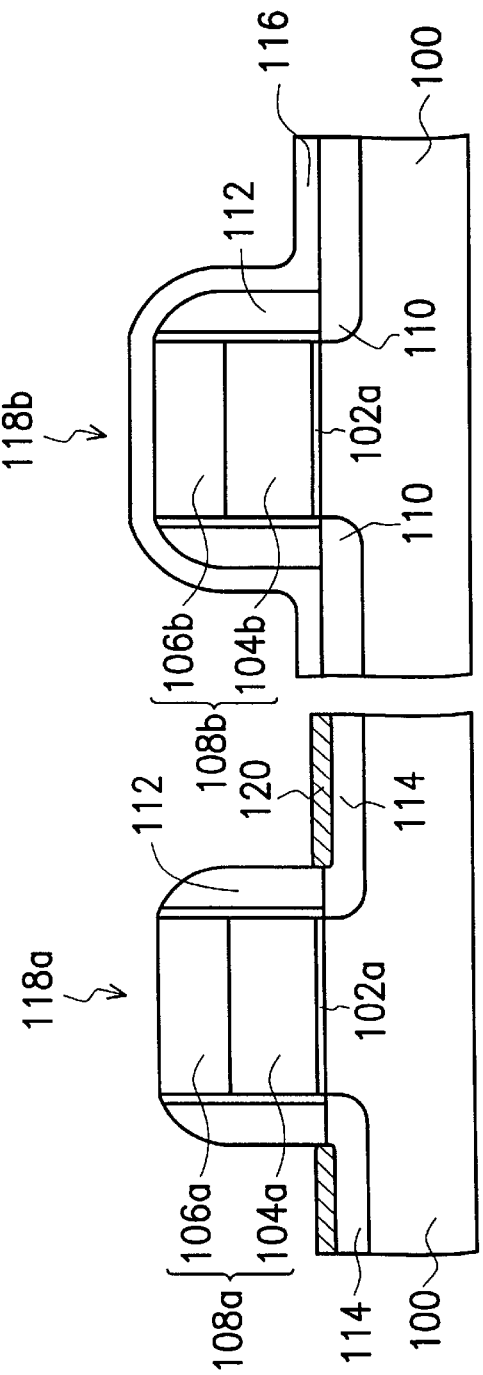
Figure 2:
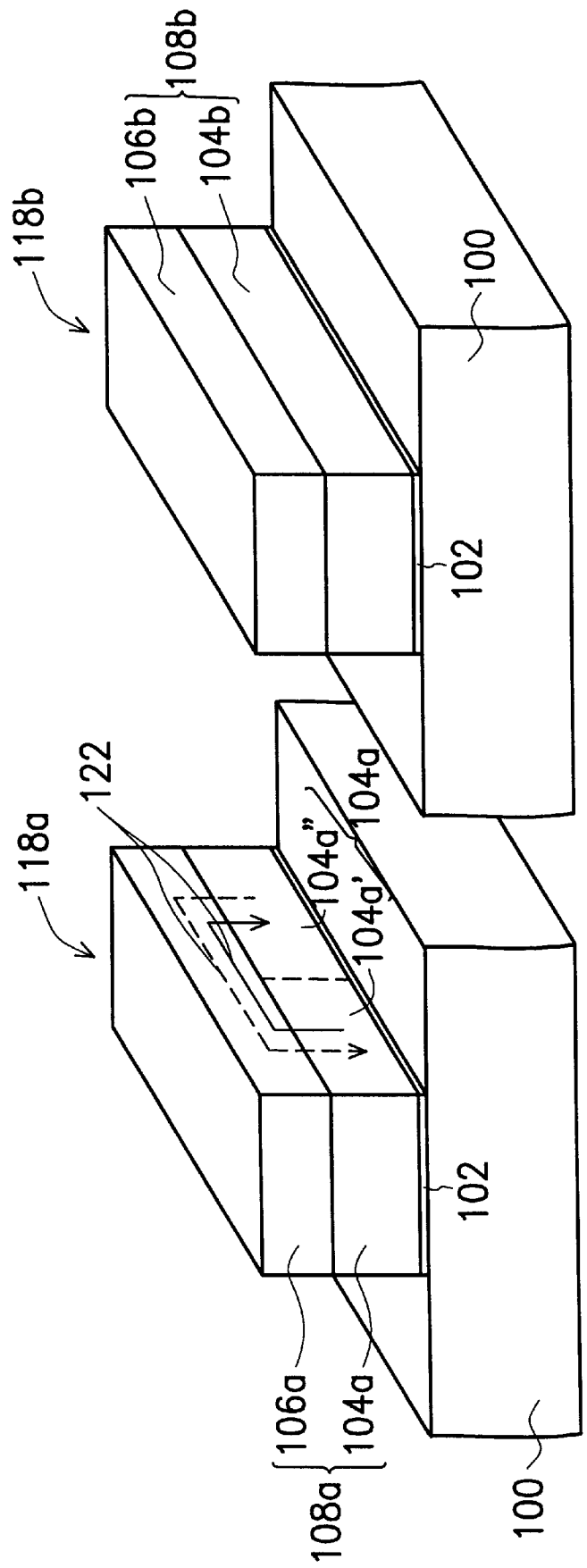
FIG. 2 is a perspective view of dual gate structure 108a and gate structure 108b of FIG. 1.

In order to enhance the conductivity of poly gate, a tungsten silicide layer is provided on the polysilicon layer in the dual gate structure of the logical circuitry in embedded DRAM. However, P-type and N-type ions in the polysilicon layer are diffused through the tungsten silicide layer while thermal processes are performed subsequently, such that interdiffusion is induced. Therefore, a method of fabricating a dual gate structure is applied in this invention. A polysilicon layer is used to form a dual gate structure in the logic circuitry to prevent from interdiffusion and a salicide layer is formed on the dual gate structure to improve conductivity thereof. FIGS. 3A–3D shows a preferred embodiment of the invention.

Referring to FIG. 3A, a memory cell region 302 and a logical circuitry 304 are defined on a substrate 300. A gate oxide layer 306 with a thickness of about 30–200 Å is formed on the substrate 300 by thermal oxidation, and a conductive layer 308, including a polysilicon layer 310 and a tungsten silicide layer 312, is formed on the gate oxide layer 306. The polysilicon layer 310 is doped in situ with N-type ions to enhance its conductivity. An insulated layer 314, such as a silicon nitride layer, is then formed on the tungsten silicide layer 312.

The insulated layer 314 and the conductive layer 308 are patterned by photolithography to form a gate structure 316 in the memory cell region 302, as shown in FIG. 3B. The insulated layer 314 and the conductive layer 308 in the logic circuitry 304 are removed to expose the gate oxide layer 306.

Referring to FIG. 3C, the gate oxide layer 306 of the logic circuitry 304 is then removed by wet etching in HF solution, for example. An oxide layer 318 with a thickness of about 20–150 Å is formed thermally on the substrate 300 of the logic circuitry 304, and an oxide layer 320 in the memory cell region 320 is formed simultaneously with the oxide layer 318 to protect the gate structure 316.

Referring FIG. 3C again, a polysilicon layer is deposited, patterned and doped with P-type and N-type impurities to form a dual gate structure 322 in the logic circuitry. During the fabrication of the dual gate 322, a polysilicon spacer 324 is formed on the sidewall of the gate structure 316. Since the tungsten silicide layer formed in the logic circuitry 304 is removed, the dual gate structure 322 including only a polysilicon layer can avoid ion interdiffusion in the dual gate structure through tungsten silicide layer.

Referring to FIG. 3D the polysilicon spacer 324 in the memory cell region 302 is removed by wet etching, for example, and a mask layer (not shown) can be formed on the dual gate structure 322 to protect the dual gate structure 322 from being damaged while removing the polysilicon spacer 324. An insulated layer is then formed over the substrate 300 and etched back to form an insulated spacer 326a, 326b on the sidewalls of the gate structure 316 and the dual gate structure 322. The insulated layer includes a silicon nitride layer and as a result, a nitride spacer is formed on the sidewalls of the gate structure 316 and the dual gate structure 322.

Referring to FIG. 3D again, a source/drain region 328a, 328b is formed on the substrate 300 beside the gate structure 316 and the dual gate structure 322. A silicide layer 330 including salicide is formed on the dual gate structure 322 and the source/drain region 328b in the logic circuitry 304. The salicide 330 is formed by first forming a mask layer on the memory cell region 302, and then forming a titanium layer on the substrate 300 to react with silicon material by RTP and removing the unreacted titanium layer. As a result, the salicide layer 330, such as titanium silicide, is formed on the dual gate 322 and the source/drain region 328b. The formation of the salicide layer 330 can enhance the conductivity of the source/drain region 328b and the dual gate structure 322.

The tungsten polysilicon/polysilicon structure in prior art is substituted for the polysilicon layer of the dual gate in the logic circuitry of the invention to prevent interdiffusion. A salicide layer is provided on the polysilicon layer, such that the dual gate structure still has better conductivity without tungsten silicide. In addition, the gate structure in the memory cell region still includes the tungsten silicide and the conductivity of the gate structure is not reduced.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a dual gate structure of embedded DRAM, comprising:

providing a substrate having a memory cell region and a logic circuitry;

forming a conductive layer on the substrate;

forming a gate structure in the memory cell region and exposing the substrate in the logic circuitry by patterning the conductive layer;

forming a dual gate structure in the logic circuitry, such that a polysilicon spacer is formed on the sidewall of the gate structure in the memory cell region;

removing the polysilicon spacer in the memory cell region;

forming an insulated spacer on the sidewall of the gate structure and the dual gate structure; and forming a silicide layer on the exposed substrate and the dual gate structure in the logic circuitry.

2. The method according to claim 1, wherein before the step of forming a silicide layer comprises forming a source/drain region on the substrate beside the gate structure and the dual gate structure.

3. The method according to claim 1, wherein the method of removing the polysilicon spacer comprises wet etching.

4. The method according to claim 1, wherein the insulated spacer comprises nitride spacer.

5. The method according to claim 1, wherein forming a silicide further comprises forming a titanium layer on the substrate;

performing a thermal process to form the silicide layer on the exposed substrate and the dual gate structure in the logic circuitry; and removing the unreacted titanium layer.

6. A method of fabricating a dual gate structure of embedded DRAM, comprising:

providing a substrate having a memory cell region and a logic circuitry;

forming a first gate oxide layer, a first polysilicon layer, a tungsten silicide layer and a cap layer on the substrate;

forming a gate structure in the memory cell region and exposing the first gate oxide layer in the logic circuitry by patterning the cap layer, the tungsten silicide layer, the first polysilicon layer and the gate oxide layer;

forming a second polysilicon layer;

forming a dual gate structure in the logic circuitry and a polysilicon spacer on the sidewall of the gate structure in the memory cell region by patterning the second polysilicon layer;

removing the polysilicon spacer in the memory cell region;

forming an insulated spacer on the sidewall of the gate structure and the dual gate structure; and forming a silicide layer on the exposed substrate and the dual gate structure in the logic circuitry.

7. The method according to claim 6, wherein after the step of forming a gate structure and before the step of forming a second polysilicon layer further comprises removing the first gate oxide layer of the logic circuitry; and forming a second gate oxide layer on the substrate of the circuitry.

8. The method according to claim 7, wherein removing the first gate oxide layer comprises wet etching.

9. The method according to claim 6, wherein the step of removing the polysilicon spacer comprises wet etching.

10. The method according to claim 6, wherein forming an insulated spacer on the sidewalls of the gate structure and the dual gate structure further comprises forming an insulated layer over the substrate; and patterning the insulated layer to form the insulated spacer on the sidewalls of the gate structure and the dual gate structure by anisotropic etching.

11. The method according to claim 9, wherein the insulated layer comprises silicon nitride layer.

12. A method of fabricating a dual gate structure of embedded DRAM, comprising:

providing a substrate having a memory cell region and a logic circuitry;

forming a conductive layer on the substrate;

forming a gate structure in the memory cell region and exposing the substrate of the logic circuitry by patterning the conductive layer;

forming a polysilicon layer over the substrate; and forming a dual gate structure in the logic circuitry by patterning the polysilicon layer.

13. The method according to claim 12, wherein forming a dual gate structure in the logic circuitry by patterning the polysilicon layer further comprises a polysilicon spacer formed on the sidewall of the gate structure 316.

14. A method of fabricating a dual gate structure of embedded DRAM, comprising:

providing a substrate having a memory cell region and a logic circuitry;

forming a conductive layer on the substrate;

forming a cap layer on the conductive layer;

forming a gate structure in the memory cell region and exposing the substrate in the logic circuitry by patterning the conductive layer;

forming a dual gate structure in the logic circuitry, such that a polysilicon spacer is formed on the sidewall of the gate structure in the memory cell region;

removing the polysilicon layer spacer in the memory cell region;

forming an insulated spacer on the sidewall of the gate structure and the dual gate structure; and forming a silicide layer on the exposed substrate and the dual gate structure in the logic circuitry.

15. A method of fabricating a dual gate structure of embedded DRAM, comprising:

providing a substrate having a memory cell region and a logic circuitry;

forming a first gate oxide layer, a first polysilicon layer, a tungsten silicide layer, and a cap layer comprising silicon nitride, on the substrate;

forming a gate structure in the memory cell region and exposing the first gate oxide layer in the logic circuitry by patterning the cap layer, the tungsten silicide layer, the first polysilicon layer and the gate oxide layer;

forming a second polysilicon layer;

forming a dual gate structure in the logic circuitry and a polysilicon spacer on the sidewall of the gate structure in the memory cell region by patterning the second polysilicon layer;

removing the polysilicon spacer in the memory cell region;

forming an insulated spacer on the sidewall of the gate structure and the dual gate structure; and forming a silicide layer on the exposed substrate and the dual gate structure in the logic circuitry.

16. The method according to claim 15, wherein the silicide layer comprises salicide.

* * * * *